(12) United States Patent
Fisher

(10) Patent No.: US 6,391,733 B1
(45) Date of Patent: May 21, 2002

(54) METHOD OF DOPING SEMICONDUCTOR DEVICES THROUGH A LAYER OF DIELECTRIC MATERIAL

(75) Inventor: Philip A. Fisher, Foster City, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/849,646

(22) Filed: May 4, 2001

(51) Int. Cl.[7] .............................................. H01L 21/336
(52) U.S. Cl. ...................... 438/305; 438/307; 438/549; 438/923
(58) Field of Search ................................. 438/303, 305, 438/306, 307, 529, 549, 923, 965

(56) References Cited

U.S. PATENT DOCUMENTS

| 4,908,326 A | | 3/1990 | Ma et al. ..................... 438/307 |
|---|---|---|---|
| 5,166,087 A | * | 11/1992 | Kakimoto et al. ........... 438/307 |
| 5,234,850 A | | 8/1993 | Liao ............................ 438/305 |
| 5,501,997 A | | 3/1996 | Lin et al. ..................... 438/303 |
| 5,512,506 A | * | 4/1996 | Chang et al. ................ 438/307 |
| 5,770,508 A | | 6/1998 | Yeh et al. .................... 438/307 |
| 5,783,475 A | | 7/1998 | Ramaswami ................ 438/595 |
| 5,863,824 A | | 1/1999 | Gardner et al. ............. 438/303 |
| 6,156,598 A | | 12/2000 | Zhou et al. .................. 438/303 |
| 6,255,181 B1 | * | 7/2001 | Song et al. .................. 438/305 |

FOREIGN PATENT DOCUMENTS

JP        2-98143      *   4/1990

* cited by examiner

Primary Examiner—Chandra Chaudhari
(74) Attorney, Agent, or Firm—Renner, Otto, Boisselle & Sklar, LLP

(57) ABSTRACT

A method of making a semiconductor device includes performing a doping implant through a layer of dielectric material. The implanting through dielectric material enables use of high-energy implants to form shallow doped regions. Other implanting steps may also be combined with the implanting through the dielectric material.

30 Claims, 3 Drawing Sheets

METHOD OF DOPING SEMICONDUCTOR DEVICES THROUGH A LAYER OF DIELECTRIC MATERIAL

BACKGROUND OF THE INVENTION

1. Technical Field

The present invention generally relates to methods for manufacturing the semiconductor devices and, more particularly, to methods for doping semiconductor materials of such devices.

2. Description of the Related Art

The semiconductor industry is increasingly characterized by a growing trend toward fabricating larger and more complex circuits on a given semiconductor chip. This is being achieved by reducing the size of individual devices within the circuits and spacing the devices closer together. The reduction of the size of individual devices and the closer spacing brings about improved electrical performance.

As active semiconductor layers are made thinner, difficulties arise in doping such active layers, due to the very low energy implants used to dope thin layers, and the difficulty in controlling the implant energy for such implants.

SUMMARY OF THE INVENTION

A method of making a semiconductor device includes performing a doping implant through a layer of dielectric material. The implanting through dielectric material enables use of high-energy implants to form shallow doped regions. Other implanting steps may also be combined with the implanting through the dielectric material.

According to an aspect of the invention, a method of producing a semiconductor device includes the steps of: a) performing a first doping implant in semiconductor material on opposite sides of a gate, thereby forming a source extension and a drain extension in the semiconductor material, wherein the source extension and the drain extension are on respective opposite sides of the gate; b) covering the source extension and the drain extension with a layer of dielectric material, wherein the dielectric material completely covers the source extension and the drain extension, and wherein the layer of dielectric material has an increased thickness close to the gate; and c) performing a second doping implant in the semiconductor material on opposite sides of the gate, the second doping implant being made through the layer of dielectric material which completely covers the source extension and the drain extension.

According to another aspect of the invention, a method of forming source and drain regions in a semiconductor material, includes the steps of: a) performing a first doping implant into uncovered portions of the semiconductor material, the first doping implant creating a first pair of doped semiconductor material regions on opposite respective sides of a gate; b) covering the first doped semiconductor material regions with a dielectric material, wherein the dielectric material has an increased thickness close to the gate; and c) performing a second doping implant through the dielectric material into the semiconductor material, the second doping implant creating a second pair of doped semiconductor material regions on opposite respective sides of the gate, each of the second pair of doped semiconductor material regions overlaps with a respective corresponding of the first pair of doped semiconductor material regions.

According to still another aspect of the invention, a method of forming source and drain regions of a semiconductor material device includes the steps of: a) performing a first doping implant in the semiconductor material, thereby forming first source and drain portions in the semiconductor material; b) forming a dielectric material layer over the semiconductor material; c) performing a second doping implant through the dielectric material layer, thereby forming second source and drain portions in the semiconductor material, wherein the second source portion at least partially overlaps the first source portion, and wherein the second drain portion at least partially overlaps the first drain portion; d) partially removing the dielectric material layer to uncover parts of the first and second source and drain portions; and e) performing a third doping implant through the dielectric material layer, thereby forming third source and drain portions in the semiconductor material, wherein the third source portion at least partially overlaps the first source portion and the second source portion, and wherein the third drain portion at least partially overlaps the first drain portion and the second drain portion; wherein the source region includes the first, second, and third source portions, and the drain region includes the first, second, and third drain portions.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

A method of forming source and drains of a semiconductor device includes multiple doping implants, at least one of which is made through a layer of dielectric material which fully covers the areas where the source and the drain are formed.

Figure 1:
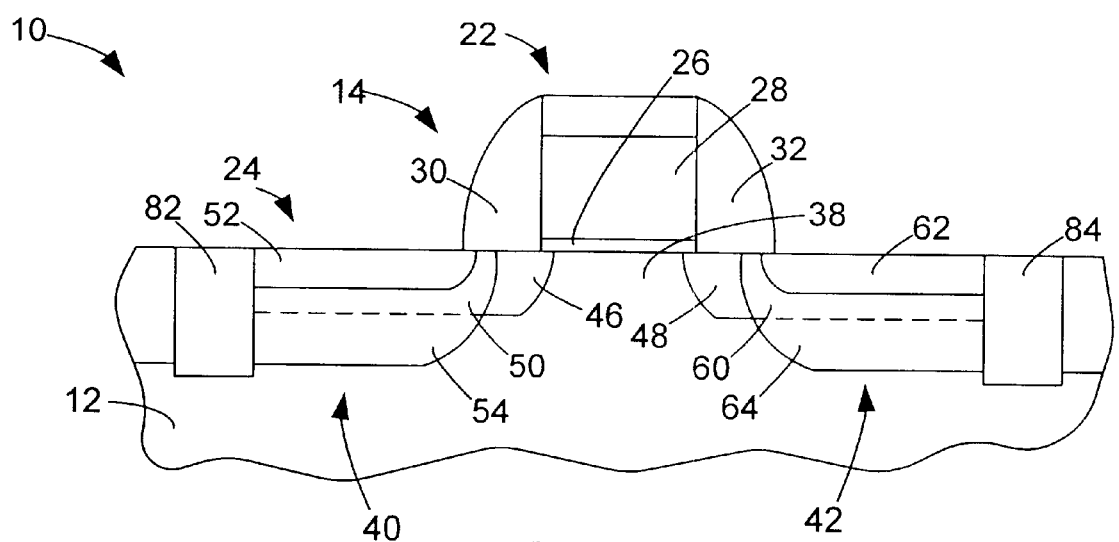
FIG. 1 is a cross-sectional view of a semiconductor device made in accordance with the method of present invention.

Referring initially to FIG. 1, a semiconductor device 10 includes a semiconductor material 12 with a transistor 14 formed thereupon. The semiconductor material 12 may be the surface semiconductor layer of a semiconductor-on-insulator (SOI) wafer. More specifically, the semiconductor material 12 may be a surface semiconductor layer of an SOI wafer. The surface semiconductor layer may have a thickness of 500 nm or less, and may have a thickness of 200 nm or less. Alternatively, the semiconductor material 12 may be part of a semiconductor material layer. The semiconductor material 12 may be made of silicon, although it will be appreciated that other suitable materials may be used instead or in addition.

The transistor 14 includes a gate 22 formed on an active semiconductor region 24 of the semiconductor material 12. The gate 22 includes a gate dielectric 26 and a gate electrode 28. In addition, spacers 30 and 32 are on respective opposite sides of the gate 22. Exemplary materials for the gate dielectric 26 are SiO$_2$ and Si$_3$N$_4$. The gate electrode 28 may be made of polysilicon or another semiconductor, or may be made in whole or in part of metal. Exemplary material for the spacers 30 and 32 are silicon nitride (Si$_3$N$_4$) and SiN.

The active region 24 includes a body 38, with a source 40 (also referred to as "source region") and a drain 42 (also referred to as "drain region") on respective opposite sides of the body. The source 40 and the drain 42 have respective source and drain extensions 46 and 48. As is conventional, the body 38 is primarily of different conductivity semiconductor material than the source 40 and the drain 42. For instance, the body 38 may be P-conductivity silicon while the source 40 and the drain 42 may be N-conductivity silicon. Alternatively, the body 38 may be N-conductivity silicon while the source 40 and the drain 42 may be P-conductivity silicon.

As explained in greater detail below, the source 40 and the drain 42 each have multiple portions or regions formed by successive doping implants. The source 40 has first, second, and third source portions 50, 52, and 54. The first source portion 50 includes the source extension 46, and is formed by lightly low-energy doping the uncovered surface of the semiconductor material 12, using the gate 22 as a doping mask. The second source portion 52 is formed by a high-energy doping implant through a layer of dielectric material fully covering the semiconductor material 12. The third source portion 54 is formed by a doping implant into partially-covered semiconductor material, the semiconductor material 12 being partially covered by the spacers 30 and 32.

Thus the source portions 50–54 of the source 40 may have the relative positional relationships shown in FIG. 1. The first source portion 50 includes the source extension 46, which may be closer to the gate 22 than the second and third source portions 52 and 54. The second source portion 52 may be fully contained within the first source portion 50, and/or may be fully contained within the third source portion 54. The third source portion 54 may contain a region which is deeper (further from the surface of the semiconductor material 12) than the first and second source portions 50 and 52. However, it will be appreciated that the source portions 50–54 may be positionally related other than as described above.

As an example, the first source portion 50 may be shallow and fairly heavily doped. The third source portion 54 may be deep and also fairly heavily doped. The third source portion 54 may extend to the bottom of the surface semiconductor layer upon which the transistor 14 is formed. The second source portion 52 may have a heavier doping than either the first source portion or the third source portion, and may extend to the bottom of the surface semiconductor layer. It will be appreciated that the doping in the portions, especially in the first source portion 50 and the third source portion 54, may be limited to avoid undesirable diffusion of the doping material under the gate 22. Excessive diffusion of the doping material under the gate 22 may cause failure of the device. Concerns of diffusion of the doping material from the second source portion 52 are less pronounced, due to the increased distance between the second source portion and the gate 22.

The drain 42 has first, second, and third drain portions 60, 62, and 64, which correspond to the source portions 50, 52, and 54.

The active region 24 is laterally isolated from other structures of the device 10 by insulator-filled trenches 82 and 84 on opposite sides of the active region. The insulator-filled trenches 82 and 84 may be trenches filled with silicon dioxide (SiO$_2$) using known shallow trench isolation (STI) techniques.

Figure 2:
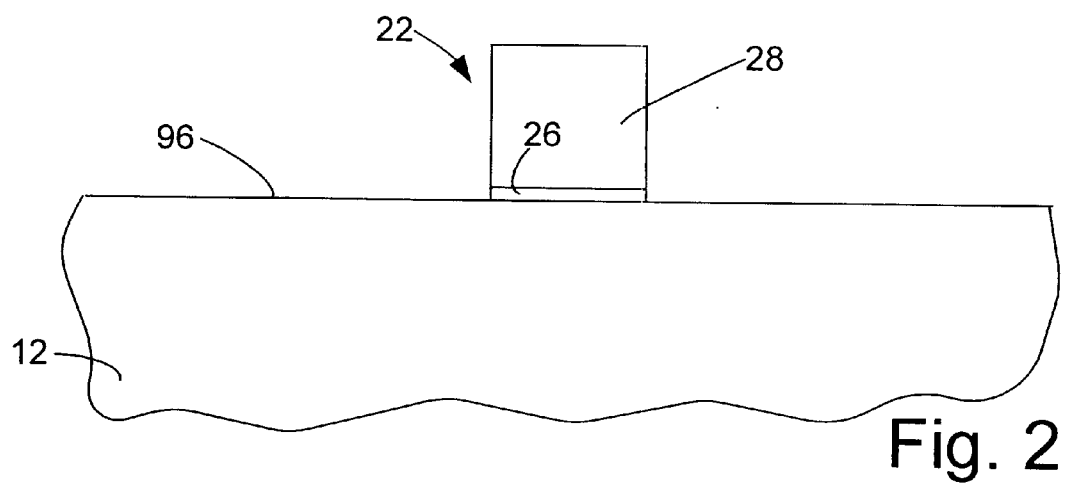
FIGS. 2–9 are cross-sectional views of various steps in a method of fabricating the semiconductor device of FIG. 1.

Various steps in the fabrication of the above-described semiconductor device 10 are illustrated in FIGS. 2–9. Referring initially to FIG. 2, starting initially with the semiconductor material 12, the gate 22 is formed thereupon. The gate 22 may be formed using well-known processes. For example, a layer of dielectric material may be deposited on a surface 96 of the semiconductor material 12, with a layer of semiconductor material then deposited thereupon. The layers may selectively be etched to form the gate dielectric 26 and the gate electrode 28. The gate electrode 28 may be made out of polysilicon which may be deposited using well-known processes such as low pressure chemical vapor deposition (LPCVD).

Figure 3:
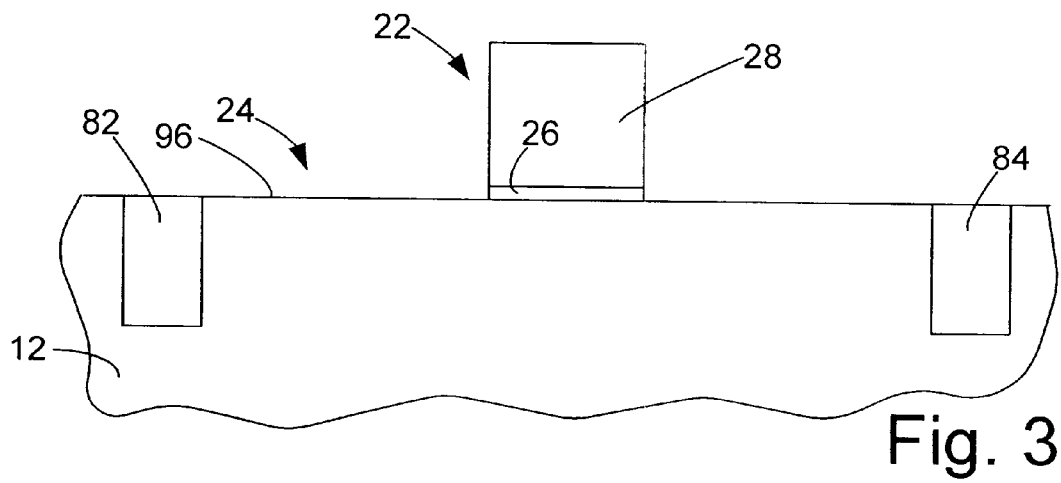

As illustrated in FIG. 3, insulator-filled trenches 82 and 84 are then created in the semiconductor material 12. The insulator-filled trenches 82 and 84 define and laterally isolated the active region 24 of the semiconductor material 12. The insulator-filled trenches may be formed using conventional well-known shallow trench isolation (STI) techniques. An exemplary process for forming an insulating trench 82 and 84 includes forming a thin layer of oxide, approximately 150–200 Angstroms thick, on the wafer surface 96 and a top surface of the gate 22, and forming a silicon nitride mask thereon. The mask covers and protects the substrate in the area where the active region 24 are to be formed while leaving exposed the area where the insulator-filled trenches 82 and 84 are to be formed.

Thereafter, the unmasked portions of the semiconductor material 12 (e.g. the portions where the silicon nitride mask has been etched away) are etched away to form an open trench. The etching process for a silicon substrate is typically an anisotropic dry etch using hydrogen bromide (HBr) which has selectivity characteristics such that it etches the silicon substrate but not the silicon nitride mask.

The open trench is filled by depositing silicon dioxide (SiO$_2$), formed by a chemical reaction involving SiH$_4$ or TEOS, to form insulating trenches 82 and 84. After filling the open trench the surface of the wafer is polished using a chemical mechanical polish to remove any excess silicon dioxide layer and the remaining silicon nitride mask.

It will be appreciated that the trenching may be performed at another point in the process, either earlier or later, if desired.

Figure 4:
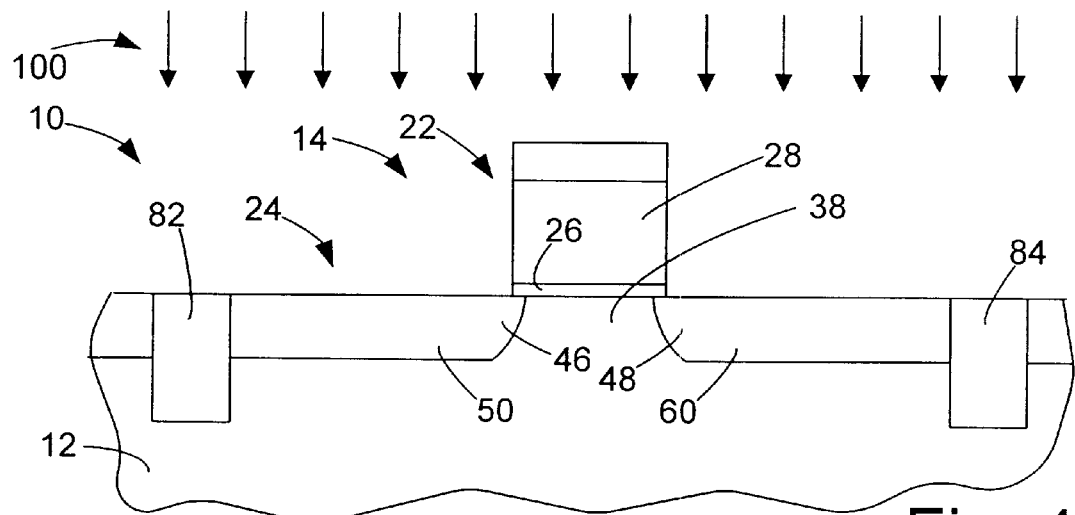

Thereafter, as illustrated in FIG. 4, a low-energy first doping implant 100 is used to create the first source and drain portions 50 and 60, including the respective extensions 46 and 48. Typical N-type implant materials include P, As, and Sb. Typical P-type implant materials include Al, Ga, B, BF$_2$, and In. An exemplary energy range for the low-energy implantation 100 is about 5 to 80 KeV, and an exemplary range of concentrations for the low-energy implantation 100 is between $10^{12}$ and $10^{15}$ atoms/cm$^2$.

Figure 5:
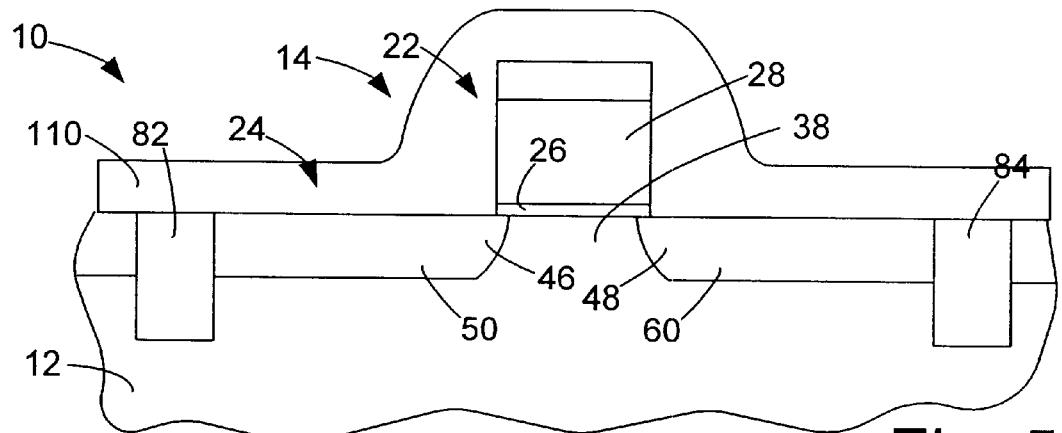

Turning now to FIG. 5, a dielectric material layer 110 is then formed. The dielectric material layer 110 may be made of a dielectric material such as Si$_3$N$_4$ or SiN. The deposit of the dielectric material layer 110 may be accomplished by conventional means, for example chemical vapor deposition (CVD) such as LPCVD or plasma enhanced chemical vapor deposition (PECVD). The thickness of the dielectric material layer 110 may be from about 350 to about 2000 Angstroms, may be from about 500 to about 2000 Angstroms, may be from about 1000 Angstroms to about 2000 Angstroms, and may be about 1000 Angstroms.

Figure 6:
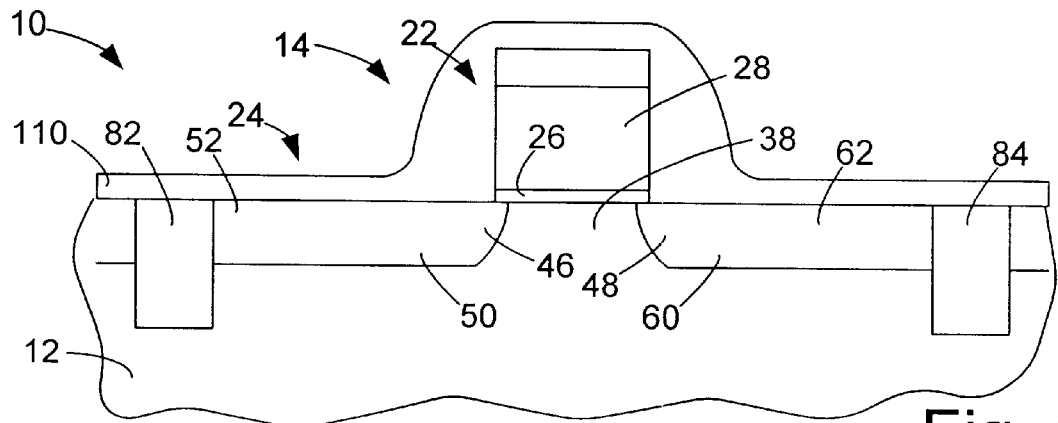
Figure 7:
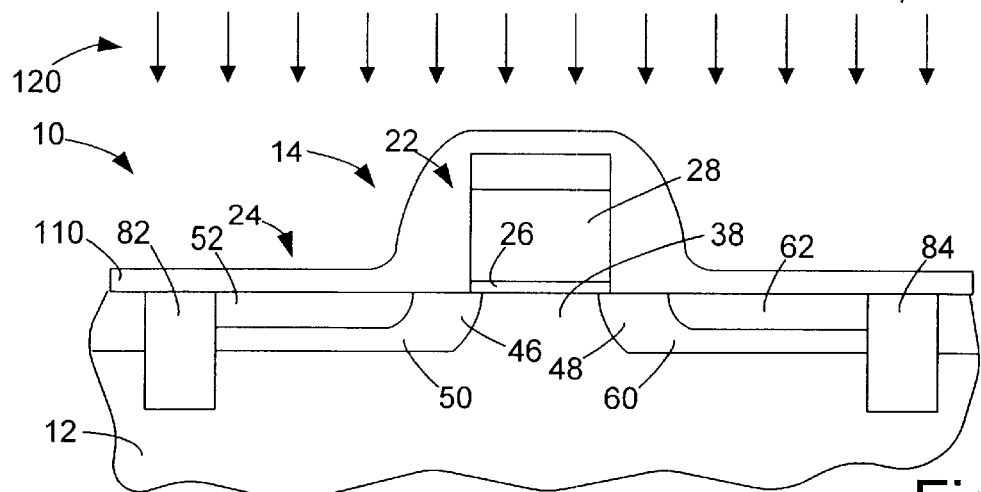

Then, as shown in FIG. 6, the dielectric material layer 110 may be thinned. The thinning may be accomplished etch back of the dielectric material layer 110, such as by etching using a suitable etchant. The thinning may be accomplished by etch-back of the dielectric layer 110, such as by dry etching or wet etching using suitable etchant compounds. Exemplary etchants are diluted phosphoric acid for wet etching, and $CF_4/HBr/He/O_2$ gas mixtures as a dry etchant. The thinning may reduce the thickness of the dielectric material layer 110 from about 1000 to 2000 Angstroms to any suitable thickness at least about 50 Angstroms. The thickness of the thinned layer may be from about 100 to about 400 Angstroms. It will be appreciated that the desired thickness of the thinned layer may be selected to achieve a desired implant penetration depth. It will be appreciated that the thickness of the dielectric layer 110 may be more controllable if it is first deposited with a greater-than-desired thickness, and then thinned. However, alternatively the dielectric material layer 110 may be formed at the desired final thickness in a single step by controlling the thickness of the deposited dielectric material.

Following the thinning, a second dopant implant 120 is made, through the dielectric layer 110, thereby forming the second source and drain portions 52 and 62. The second implant 120 may be made using the same type of ions (dopant) as the first implant 100. The second implant 120 may be shallower than the first implant 100 (i.e., the first portions 50 and 60 may have regions further from the surface of the semiconductor material 12 than are the second portions 52 and 62). The energy of the second implant 120 may be from 5 to 200 keV, and may be from 5 to 20 keV. The concentration of the second implant 120 may be from $1 \times 10^{12}$ to $1 \times 10^{16}$ atoms/cm$^2$, and may be from $1 \times 10^{14}$ to $1 \times 10^{16}$ atoms/cm$^2$. The second portions 52 and 62 may have overall thickness of from 50 to 3000 Angstroms, may have a thickness from 50 to 500 Angstroms, and may have a thickness from 200 and 500 Angstroms.

Figure 8:
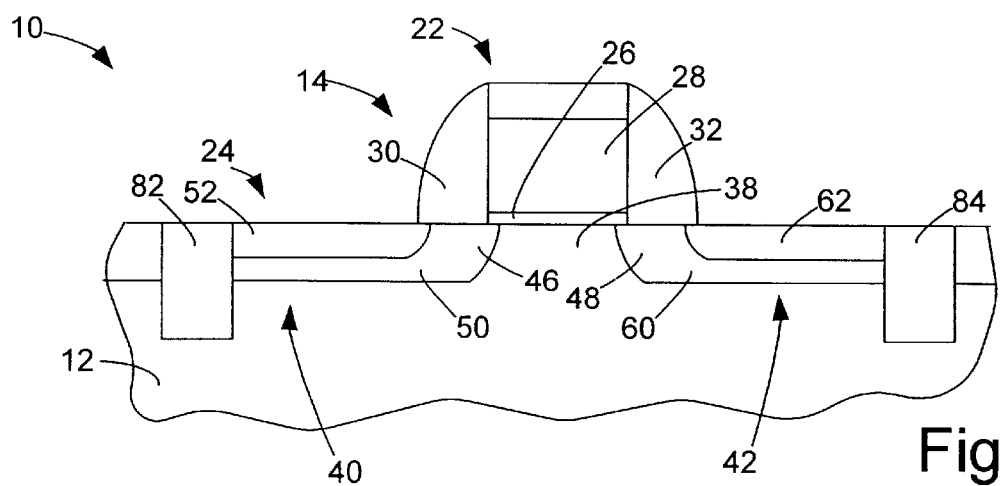

FIG. 8 illustrates the removal of the dielectric material layer 110 from part of the surface of the semiconductor material 12, thereby forming the discrete spacers 30 and 32. The selective removal of the dielectric material layer 110 may be accomplished by conventional means, for example by anisotropic etching using suitable, well-known etchants, an exemplary etchant being $CHF_3$.

Figure 9:
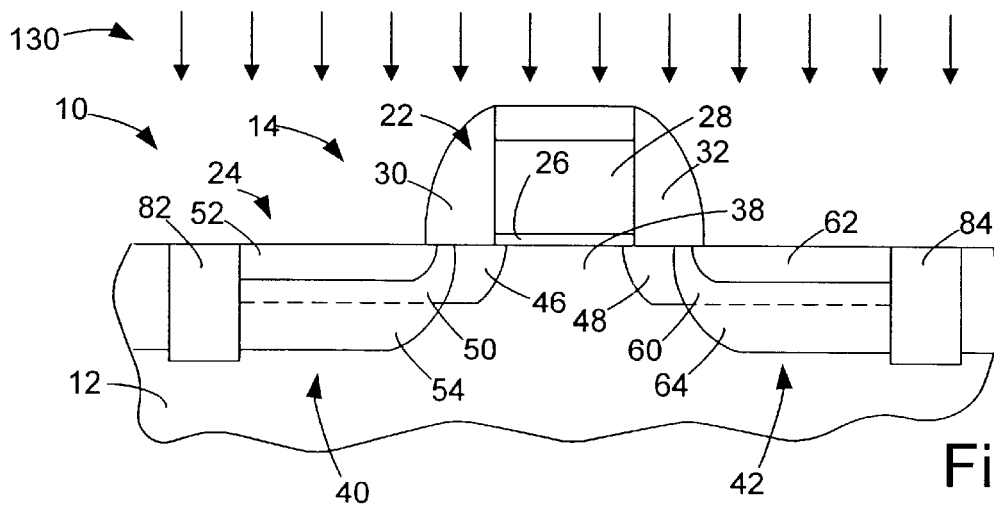

As shown in FIG. 9, a third doping implant 130 is then performed, forming the third source and drain portions 54 and 64. The third doping implant 130 may utilize the same dopant as the implants 100 and 120. Alternatively, the implants 100, 120, and 130 may utilize different dopants. The energy of the third implant 130 may be from 5 to 30 keV, and may be less than or greater than the energy for the second implant 120. The concentration of the third implant 130 may be from $5 \times 10^{14}$ to $1 \times 10^{16}$ atoms/cm$^2$. It will be appreciated that the energy and concentration of the implants may vary greatly depending on the type of material implanted.

It will be appreciated that the ranges given above, such as ranges of energies, concentrations, and thickness, are only exemplary, and that other suitable values may be used instead. It will also be appreciated that different ranges may be used for different transistors on different parts of the same device. For example, different dielectric material layer thicknesses may be utilized to separately engineer NMOS and PMOS transistors.

It will be appreciated that the above method is only an example, and that some of the above steps may be omitted, and/or additional steps may be added, as suitable and desired. For example, the process may include a greater or lesser number of implants, if desired. As another example, the shallow trench isolation step may be performed at a different stage during the manufacturing process.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method of producing a semiconductor device, the method comprising:

performing a first doping implant in semiconductor material on opposite sides of a gate, thereby forming a source extension and a drain extension in the semiconductor material, wherein the source extension and the drain extension are on respective opposite sides of the gate;

covering the source extension and the drain extension with a layer of dielectric material, wherein the dielectric material completely covers the source extension and the drain extension, and wherein the layer of dielectric material has an increased thickness close to the gate;

performing a second doping implant in the semiconductor material on opposite sides of the gate, the second doping implant being made through the layer of dielectric material which completely covers the source extension and the drain extension;

removing portions of the dielectric material to partially uncover the semiconductor material; and performing a third doping implant in the semiconductor material on opposite sides of the gate.

2. The method of claim 1, further comprising, prior to the performing the second doping implant, thinning the dielectric material.

3. The method of claim 2, wherein the dielectric material, after the thinning, has a thickness of from 100 to 400 Angstroms, away from the gate.

4. The method of claim 3, wherein the thinning includes etching the dielectric material.

5. The method of claim 1, wherein the first doping implant and the second doping implant utilize the same dopant, and wherein the second doping implant involves higher energy implanting than the first doping implant.

6. The method of claim 1, wherein the second doping implant includes implanting with an energy of from 5 to 200 keV.

7. The method of claim 1, wherein the covering includes deposition of the dielectric material via chemical vapor deposition.

8. A method of forming source and drain regions in a semiconductor material, the method comprising:

performing a first doping implant into uncovered portions of the semiconductor material, the first doping implant creating a first pair of doped semiconductor material regions on opposite respective sides of a gate;

covering the first doped semiconductor material regions with a dielectric material, wherein the dielectric material has an increased thickness close to the gate; and performing a second doping implant through the dielectric material into the semiconductor material, the second doping implant creating a second pair of doped semiconductor material regions on opposite respective sides of the gate, wherein each of the second pair of doped semiconductor material regions overlaps with a respective corresponding of the first pair of doped semiconductor material regions;

wherein the first pair of doped semiconductor material regions include portions farther from a surface of the semiconductor material than the second pair of doped semiconductor material regions.

9. The method of claim 8, wherein the first doping implant and the second doping implant utilize the same dopant, and wherein the second doping implant involves higher energy implanting than the first doping implant.

10. The method of claim 8, further comprising, subsequent to the covering and prior to the performing the second doping implant, thinning the dielectric material.

11. The method of claim 10, wherein the dielectric material, after the thinning, has a thickness of from 100 to 400 Angstroms, away from the gate.

12. The method of claim 10, wherein the thinning includes etching the dielectric material.

13. A method of forming source and drain regions in a semiconductor material, the method comprising:

performing a first doping implant into uncovered portions of the semiconductor material, the first doping implant creating a first pair of doped semiconductor material regions on opposite respective sides of a gate;

covering the first doped semiconductor material regions with a dielectric material, wherein the dielectric material has an increased thickness close to the gate;

performing a second doping implant through the dielectric material into the semiconductor material, the second doping implant creating a second pair of doped semiconductor material regions on opposite respective sides of the gate, wherein each of the second pair of doped semiconductor material regions overlaps with a respective corresponding of the first pair of doped semiconductor material regions;

removing portions of the dielectric material to partially uncover the semiconductor material; and performing a third doping implant in the semiconductor material on opposite sides of the gate.

14. The method of claim 13, wherein the first, second, and third doping implants all utilize the same dopant, wherein the second doping implant involves higher energy implanting than the first doping implant, and wherein the third doping implant involves higher energy implanting than the first doping implant.

15. The method of claim 8, wherein the second doping implant includes implanting with an energy of from 6 to 200 keV.

16. The method of claim 8, wherein a thickness of the second pair of doped semiconductor material regions is less than or equal to 500 Angstroms.

17. The method of claim 8, wherein the first pair of doped semiconductor material regions include portions closer to the gates than the second pair of doped semiconductor material regions.

18. The method of claim 8, wherein the covering includes deposition of the dielectric material via chemical vapor deposition.

19. A method of forming source and drain regions of a semiconductor material device, comprising:

performing a first doping implant in the semiconductor material, thereby forming first source and drain portions in the semiconductor material;

forming a dielectric material layer over the semiconductor material;

performing a second doping implant through the dielectric material layer, thereby forming second source and drain portions in the semiconductor material, wherein the second source portion at least partially overlaps the first source portion, and wherein the second drain portion at least partially overlaps the first drain portion;

partially removing the dielectric material layer to uncover parts of the first and second source and drain portions; and performing a third doping implant through the dielectric material layer, thereby forming third source and drain portions in the semiconductor material, wherein the third source portion at least partially overlaps the first source portion and the second source portion, and wherein the third drain portion at least partially overlaps the first drain portion and the second drain portion;

wherein the source region includes the first, second, and third source portions, and the drain region includes the first, second, and third drain portions.

20. The method of claim 13, further comprising, subsequent to the covering and prior to the performing the second doping implant, thinning the dielectric material.

21. A method of forming source and drain regions in a semiconductor material, the method comprising:

performing a first doping implant into uncovered portions of the semiconductor material, the first doping implant creating a first pair of doped semiconductor material regions on opposite respective sides of a gate;

covering the first doped semiconductor material regions with a dielectric material, wherein the dielectric material has an increased thickness close to the gate; and performing a second doping implant through the dielectric material into the semiconductor material, the second doping implant creating a second pair of doped semiconductor material regions on opposite respective sides of the gate;

wherein each of the second pair of doped semiconductor material regions is fully contained within a respective corresponding of the first pair of doped semiconductor material regions.

22. The method of claim 21, further comprising, subsequent to the covering and prior to the performing the second doping implant, thinning the dielectric material.

23. A method of forming source and drain regions in a semiconductor material, the method comprising:

performing a first doping implant into uncovered portions of the semiconductor material, the first doping implant creating a first pair of doped semiconductor material regions on opposite respective sides of a gate;

covering the first doped semiconductor material regions with a dielectric material;

performing a second doping implant through the dielectric material into the semiconductor material, the second doping implant creating a second pair of doped semiconductor material regions on opposite respective sides of the gate;

removing portions of the dielectric material to partially uncover the semiconductor material; and performing a third doping implant in the semiconductor material on opposite sides of the gate.

24. The method of claim 23, further comprising, subsequent to the covering and prior to the performing the second doping implant, thinning the dielectric material.

25. The method of claim 23, wherein the first, second, and third doping implants all utilize the same dopant, wherein the second doping implant involves higher energy implanting than the first doping implant, and wherein the third doping implant involves higher energy implanting than the first doping implant.

26. The method of claim 25, wherein the second doping implant is a higher energy implant than the third doping implant.

27. The method of claim 23, wherein each of the second pair of doped semiconductor material regions is fully contained within a respective corresponding of the first pair of doped semiconductor material regions.

28. The method of claim 23, wherein the second pair of doped semiconductor material regions are shallower than the first pair of doped semiconductor material regions.

29. The method of claim 23, wherein the third doping implant creates a third pair of doped semiconductor material regions on opposite respective sides of the gate, and wherein the third pair of doped semiconductor material regions are deeper than the second pair of doped semiconductor material regions.

30. The method of claim 29, wherein the third pair of doped semiconductor material regions are deeper than the first pair of doped semiconductor material regions.

* * * * *